(12) United States Patent
Kim

(10) Patent No.: US 10,199,598 B2
(45) Date of Patent: Feb. 5, 2019

(54) DISPLAY DEVICE AND MANUFACTURING METHOD OF THE SAME

(71) Applicant: SAMSUNG DISPLAY CO., LTD., Yongin-si, Gyeonggi-do (KR)

(72) Inventor: Yongil Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/827,061

(22) Filed: Nov. 30, 2017

(65) Prior Publication Data

US 2018/0159072 A1    Jun. 7, 2018

(30) Foreign Application Priority Data

Dec. 1, 2016  (KR) .................. 10-2016-0162789

(51) Int. Cl.
| | |
|---|---|
| *H01L 51/50* | (2006.01) |
| *H01L 27/32* | (2006.01) |
| *H01L 51/52* | (2006.01) |
| *H01L 51/56* | (2006.01) |
| *G02F 1/13* | (2006.01) |
| *G02F 1/1333* | (2006.01) |

(52) U.S. Cl.
CPC .......... *H01L 51/5246* (2013.01); *G02F 1/13* (2013.01); *H01L 27/3244* (2013.01); *H01L 27/3246* (2013.01); *H01L 27/3262* (2013.01); *H01L 51/5056* (2013.01); *H01L 51/5072* (2013.01); *H01L 51/5088* (2013.01); *H01L 51/5092* (2013.01); *H01L 51/56* (2013.01); *G02F 2001/133388* (2013.01)

(58) Field of Classification Search
CPC .......... G02F 1/13; G02F 2001/133388; H01L 27/3244
USPC .............................. 257/40; 345/55
See application file for complete search history.

(56) References Cited

U.S. PATENT DOCUMENTS

| 8,389,323 B2 | 3/2013 | Choi et al. |
| 2004/0137142 A1 | 7/2004 | Nishikawa |

(Continued)

FOREIGN PATENT DOCUMENTS

| KR | 10-0572657 B1 | 4/2006 |
| KR | 10-1213491 B1 | 12/2012 |

(Continued)

OTHER PUBLICATIONS

Chesterfield, et al., "Solution-Coating Technology for AMOLED Displays", Information Display, frontline technology, p. 24-30, Jan. 2011.

*Primary Examiner* — David Vu
*Assistant Examiner* — Brandon Fox
(74) *Attorney, Agent, or Firm* — Lee & Morse, P.C.

(57) ABSTRACT

A display device includes a display area and a non-display area. The non-display area includes a sealing area which includes a sealing material. The display area includes a thin film transistor structure, a pixel electrode on and connected to the thin film transistor structure, and a pixel defining layer overlapping an edge of the pixel electrode. A first functional layer is on substrate on which the pixel defining layer is formed and does not overlap the sealing area. A light emitting layer is on the first functional layer and overlaps the pixel electrode, and a common electrode on the light emitting layer.

19 Claims, 10 Drawing Sheets

(56) References Cited

U.S. PATENT DOCUMENTS

| | | | | |
|---|---|---|---|---|
| 2007/0170455 A1* | 7/2007 | Choi | ................... | H01L 51/5246 |
| | | | | 257/100 |
| 2012/0261065 A1* | 10/2012 | Lee | ................... | G02F 1/133512 |
| | | | | 156/250 |
| 2012/0287026 A1* | 11/2012 | Masuda | .............. | H01L 51/5246 |
| | | | | 345/76 |
| 2015/0171150 A1* | 6/2015 | Ha | ...................... | H01L 27/3246 |
| | | | | 438/34 |
| 2016/0218165 A1 | 7/2016 | Park et al. | | |

FOREIGN PATENT DOCUMENTS

| | | |
|---|---|---|
| KR | 10-2015-0049470 A | 5/2015 |
| KR | 10-2016-0091529 A | 8/2016 |

* cited by examiner

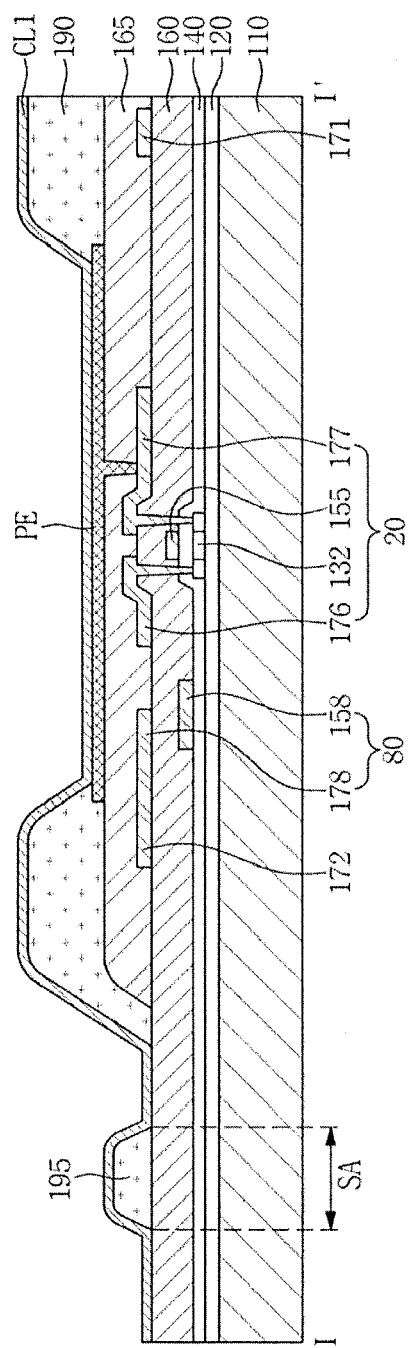

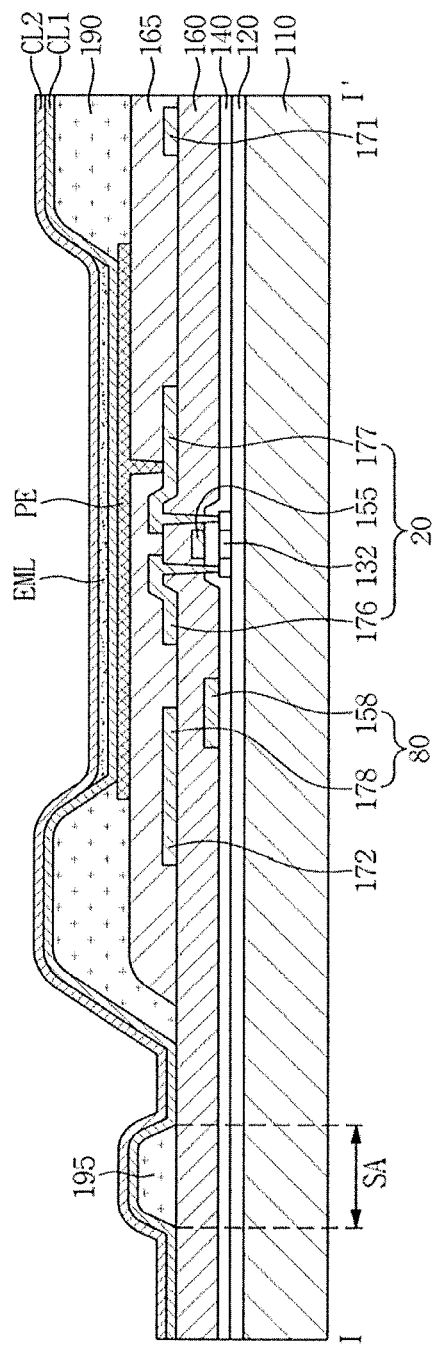

DISPLAY DEVICE AND MANUFACTURING METHOD OF THE SAME

CROSS-REFERENCE TO RELATED APPLICATION

Korean Patent Application No. 10-2016-0162789, filed on Dec. 1, 2016, and entitled, "Display Device and Manufacturing Method of the Same" is incorporated by reference herein in its entirety.

1. Field

One or more embodiments described herein relate to a display device and a method for manufacturing a display device.

2. Description of the Related Art

A variety of displays have been developed. Examples include liquid crystal displays, organic light emitting diode (OLED) display, plasma display panels, and electrophoretic displays. An OLED display is a self-emitting device having a wide viewing angle, excellent contrast ratio, and fast response speed.

One type of OLED display includes a first substrate facing a second substrate, a thin film transistor layer on the first substrate, a first electrode on the thin film transistor layer, an organic light emitting layer on the first electrode, and a second electrode on the organic light emitting layer. These layers are sequentially arranged in a stack.

The organic light emitting layer may be formed by a solution process, e.g., a dropping process or an ink-jet process. The solution process is performed in an overall coating method or a linear coating method. As a result, an organic material forming the organic light emitting layer may be placed over an entire area of the first substrate, e.g., the sealing area on which a sealing member for sealing the first and second substrates is to be disposed.

When the sealing member is placed in a state where the organic substance exists on the sealing area, reliability of the sealing member may be degraded. Accordingly, a laser drilling process or a plasma etching process may performed to remove the organic substance existing on the sealing area. In the case of the laser process, the organic substance is not completely removed because the organic material transmits the laser light rather than absorbing the laser light. Further, it is difficult to employ a plasma etching process to top-emission type light emitting elements.

SUMMARY

In accordance with one or more embodiments, a display device includes a first substrate including a non-display area and a display area, the display area including a plurality of pixels that are to emit light to display an image; a second substrate opposing the first substrate; a sealing material to seal the first substrate and the second substrate; a thin film transistor structure on the first substrate at the display area; a pixel electrode on the thin film transistor structure and connected to the thin film transistor structure; a pixel defining layer overlapping an edge of the pixel electrode; a first functional layer on the first substrate on which the pixel defining layer is formed; a light emitting layer on the first functional layer and overlapping the pixel electrode; and a common electrode on the light emitting layer, wherein the non-display area includes a sealing area which includes the sealing material and wherein the first functional layer does not overlap the sealing area.

The display device may include a second functional layer on the first substrate on which the light emitting layer is formed. The second functional layer may be over an entire surface of the first substrate except the sealing area. The second functional layer may not overlap the sealing area. The second functional layer may include at least one of an electron injection layer and an electron transport layer.

The first functional layer may include at least one of a hole injection layer and a hole transport layer. The first functional layer may be over an entire surface of the first substrate except the sealing area. The first functional layer may directly contact the pixel defining layer.

The sealing area maybe defined along an edge of the display area. The sealing material may include a glass frit.

In accordance with one or more other embodiments, a method for manufacturing a display device includes preparing a first substrate including a non-display area and a display area, the display area including a plurality of pixels to emit light to display an image; forming a thin film transistor structure on the first substrate; forming a pixel electrode on the thin film transistor structure; forming a pixel defining layer on the pixel electrode; forming a laser absorption layer on the first substrate at the non-display area; forming a first functional layer over an entire surface of the first substrate on which the pixel defining layer and the laser absorption layer are formed; and irradiating a laser to the laser absorption layer.

The laser absorption layer may be formed along an edge of the display area. Forming the pixel defining layer and forming the laser absorption layer may be performed simultaneously. The first functional layer may include at least one of a hole injection layer and a hole transport layer. The first functional layer may be formed through one of a dropping process and an ink-jet process.

The method may include forming a second functional layer over an entire surface of the first substrate on which the first functional layer is formed. The second functional layer includes at least one of an electron injection layer and an electron transport layer. The second functional layer may be formed through one of a dropping process and an ink-jet process.

BRIEF DESCRIPTION OF THE DRAWINGS

Features will become apparent to those of skill in the art by describing in detail exemplary embodiments with reference to the attached drawings in which:

FIGS. 4A-4G illustrate stages of a method for manufacturing a display device.

DETAILED DESCRIPTION

Figure 1:
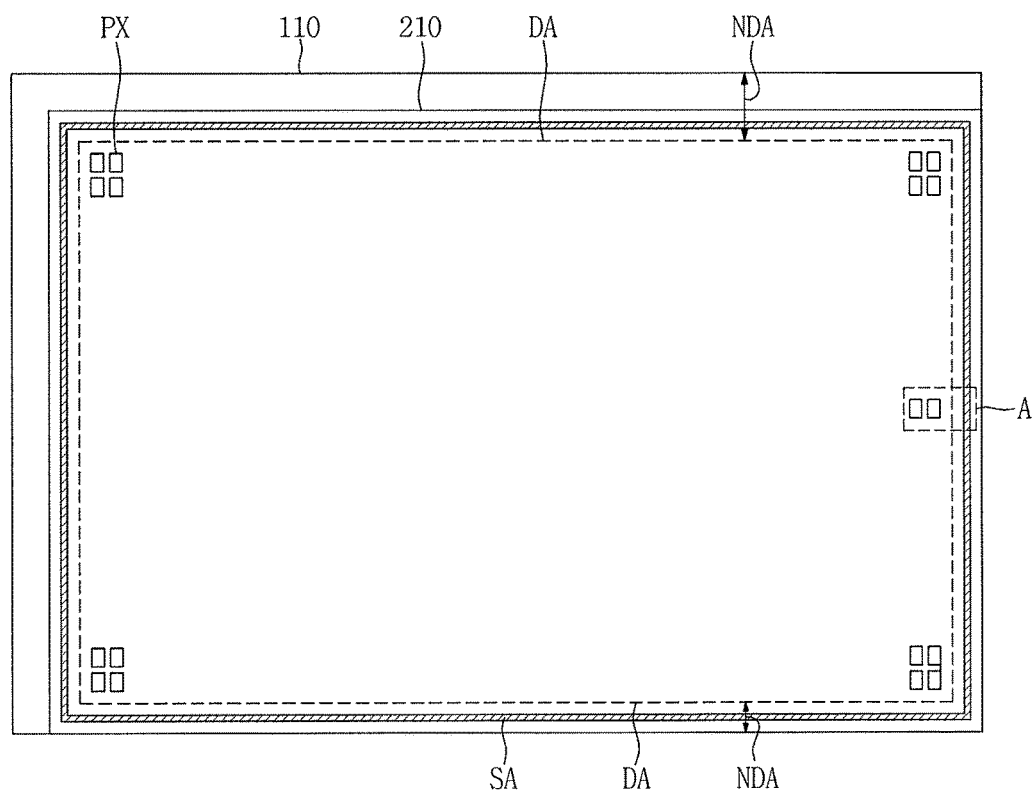
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

"About," "approximately," or "substantially," as used herein is inclusive of the stated value and means within an acceptable range of deviation for the particular value as determined by one of ordinary skill in the art, considering the measurement in question and the error associated with measurement of the particular quantity (e.g., the limitations or tolerances of the measurement system). For example, "about," "approximately," or "substantially," may mean within one or more standard deviations, or within ±30%, 20%, 10%, 5% of the stated value.

Figure 2:
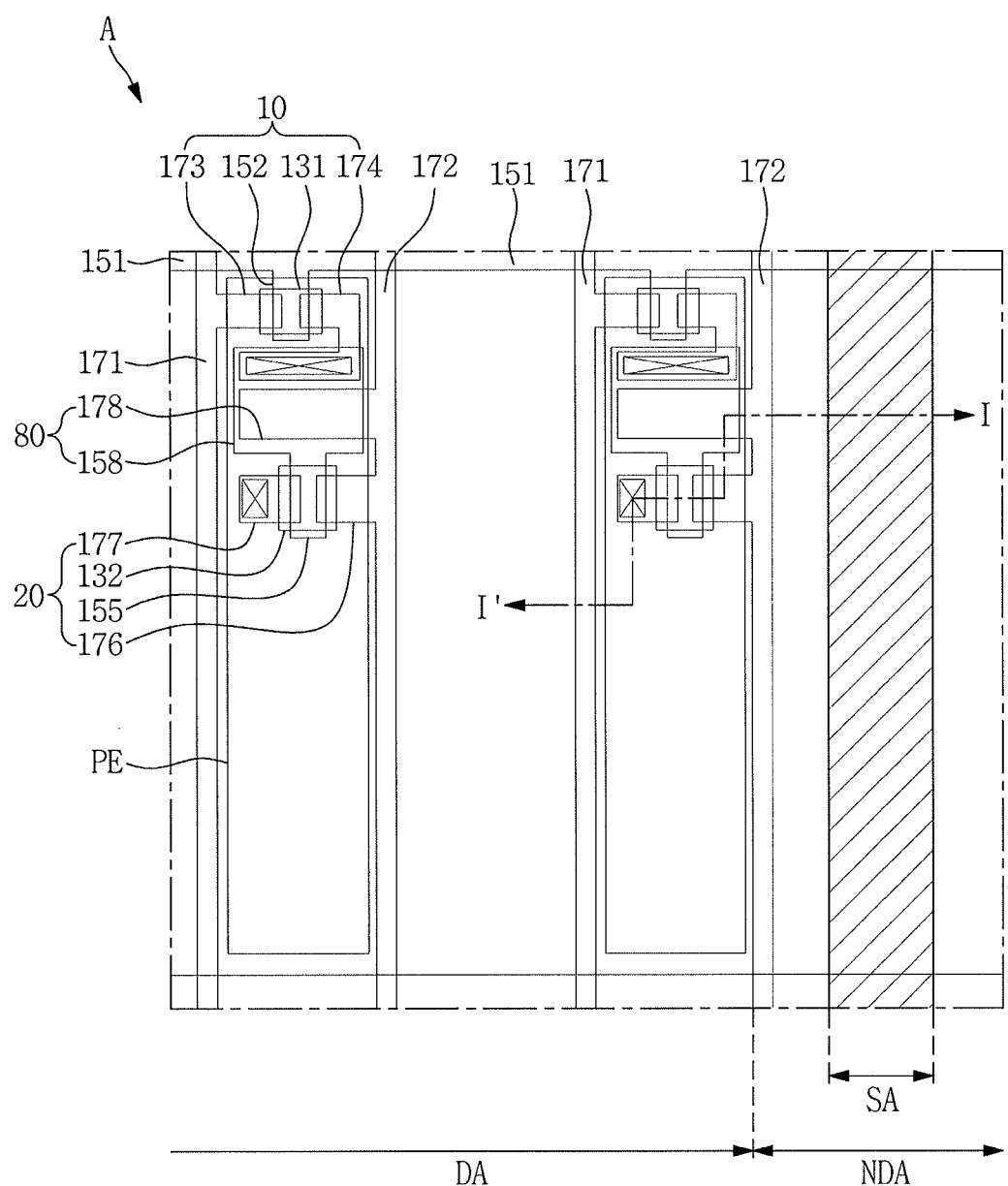
FIG. 2 illustrates an embodiment of an area A in FIG. 1.
Figure 3:
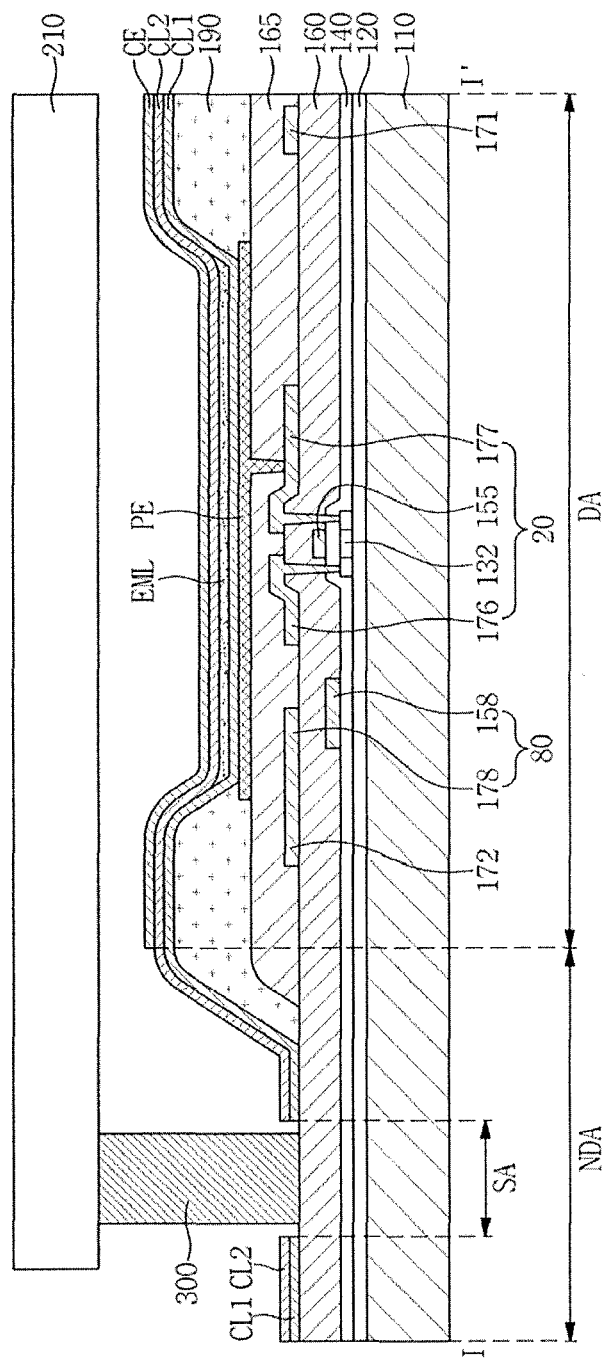
FIG. 3 illustrates a view taken along line I-I' in FIG. 2.

FIG. 1 illustrates a plan view of an embodiment of a display device, FIG. 2 illustrates an embodiment of an area A in FIG. 1, and FIG. 3 illustrates a cross-sectional view taken along the line I-I' in FIG. 2. The display device may be an OLED display device, a liquid crystal display device, an electrophoretic display device, or another type of display device.

Referring to FIGS. 1, 2, and 3, the display device includes a first substrate 110, a second substrate 210 opposing the first substrate 110, and a sealing member 300 sealing the first substrate 110 and the second substrate 210. The first substrate 110 may include a display area DA including a plurality of pixels PX for displaying images and a non-display area NDA around the display area DA. A sealing area SA may be defined at the non-display area NDA along an edge of the display area DA.

Each pixel PX may include a switching thin film transistor (TFT) 10, a driving TFT 20, a capacitor 80, a pixel electrode PE, organic light emitting layers CL1, EML and CL2, and a common electrode CE. In FIG. 2, each pixel PX includes two TFTs and one capacitor. In another embodiment, each pixel PX may include three or more TFTs and/or two or more capacitors with additional wirings.

A gate line 151, a data line 171, and a common power line 172 may be on the first substrate 100. The data line 171 and the common power line 172 may insulated from and cross the gate line 151. In one embodiment, each pixel PX may be defined by the gate line 151, the data line 171, and the common power line 172 as a boundary. In one embodiment, each pixel PX may have a different boundary. The pixels may be defined by a pixel defining layer or a black matrix.

The first substrate 110 may include a flexible material. Examples of the flexible material may include plastic materials. For example, the first substrate 110 may include at least one of kapton, polyethersulphone (PES), polycarbonate (PC), polyimide (PI), polyethyleneterephthalate (PET), polyethylene naphthalate (PEN), polyacrylate (PAR), and fiber reinforced plastic (FRP).

A buffer layer 120 is on the first substrate 110 and may be configured to substantially prevent permeation of undesirable elements and planarize a surface therebelow. The buffer layer 120 may include various suitable materials for preventing permeation and/or planarizing. For example, the buffer layer 120 may include one of a silicon nitride ($SiN_x$) layer, a silicon oxide ($SiO_2$) layer, and a silicon oxynitride ($SiO_xN_y$) layer. In one embodiment, the buffer layer 120 may be omitted, for example, when the first substrate 110 is a certain kind and/or based on predetermined process conditions.

A switching semiconductor layer 131 and a driving semiconductor layer 132 are on the buffer layer 120. The switching semiconductor layer 131 and the driving semiconductor layer 132 may include at least one of a polycrystalline silicon layer, an amorphous silicon layer and an oxide semiconductor such as indium gallium zinc oxide (IGZO), and indium zinc tin oxide (IZTO). For example, when the driving semiconductor layer 132 includes a polycrystalline silicon layer, the driving semiconductor layer 132 may include a channel area which is not doped with impurities and p+ doped source and drain areas formed on opposite sides of the channel area.

In such an exemplary embodiment, p-type impurities (e.g., boron B or another material) may be used as dopant ions. In one embodiment, $B_2H_6$ may be used. Such impurities may vary depending on the type of TFT. In one embodiment, the driving TFT 20 may be a p-channel metal oxide semiconductor (PMOS) TFT with p-type impurities. In one embodiment, the driving TFT 20 may be an n-channel metal oxide semiconductor (NMOS) TFT or a complementary metal oxide semiconductor (CMOS) TFT.

A gate insulating layer 140 is on the switching semiconductor layer 131 and the driving semiconductor layer 132. The gate insulating layer 140 may include at least one of tetraethylorthosilicate (TEOS), silicon nitride ($SiN_x$) and silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

A gate wiring including gate electrodes 152 and 155 is on the gate insulating layer 140. The gate wiring may further include the gate line 151, a first capacitor plate 158, and other wirings. The gate electrodes 152 and 155 may overlap at least a portion of the semiconductor layers 131 and 132, for example, a channel area thereof. The gate electrodes 152 and 155 serve to substantially prevent the channel area from being doped with impurities when a source area and a drain area of the semiconductor layers 131 and 132 are doped with impurities during forming of the semiconductor layers 131 and 132.

The gate electrodes 152 and 155 and the first capacitor plate 158 are on a substantially same layer and include a substantially same metal material. The gate electrodes 152 and 155 and the first capacitor plate 158 may include at least one of molybdenum (Mo), chromium (Cr), and tungsten (W).

An insulating interlayer 160 overlapping the gate electrodes 152 and 155 is on the gate insulating layer 140. Similar to the gate insulating layer 140, the insulating interlayer 160 may include or be formed of silicon nitride (SiNx), silicon oxide (SiOx), tetraethoxysilane (TEOS), or another material.

A data wiring including source electrodes 173 and 176 and drain electrodes 174 and 177 is on the insulating interlayer 160. The data wiring further includes the data line 171, the common power line 172, a second capacitor plate 178, and other wirings. The source electrodes 173 and 176 and the drain electrodes 174 and 177 are connected to the source area and the drain area of the semiconductor layers 131 and 132, respectively, through a contact hole in the gate insulating layer 140 and the insulating interlayer 160.

The switching TFT 10 includes the switching semiconductor layer 131, the switching gate electrode 152, the switching source electrode 173, and the switching drain electrode 174 and the driving TFT 20 includes the driving semiconductor layer 132, the driving gate electrode 155, the driving source electrode 176, and the driving drain electrode 177. The TFTs 10 and 20 may be a different type or have a different configuration in another embodiment.

The capacitor 80 includes an insulating interlayer 160 between the first capacitor plate 158 and the second capacitor plate 178.

The switching TFT 10 may function as a switching element to select pixels PX to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies driving power to the pixel electrode PE which allows the organic light emitting layers CL1, EML, and CL2 in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode PE through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80. A current corresponding to the voltage stored in the capacitor 80 flows to the pixel electrode PE through the driving TFT 20, such that the organic light emitting layers CL1, EML, and CL2 emit light.

A planarization layer 165 covers the data wiring, e.g., the data line 171, the common power line 172, the source electrodes 173 and 176, the drain electrodes 174 and 177, and the second capacitor plate 178, which are patterned into a single layer on the insulating interlayer 160.

The planarization layer 165 may include one or more of a polyacrylate resin, an epoxy resin, a phenolic resin, a polyamide resin, a polyimide resin, an unsaturated polyester resin, a polyphenylene-based resin (e.g., a polyphenylene ether resin), a polyphenylene sulfide resin, and benzocyclobutene (BCB).

The pixel electrode PE is on the planarization layer 165 and is connected to the drain electrode 177 through a contact hole in the planarization layer 165.

A pixel defining layer 190 is on the planarization layer 165 and exposes at least a portion of the pixel electrode PE to define a pixel area. The pixel defining layer 190 may include, for example, a resin such as a polyacrylate resin and a polyimide resin.

A first functional layer CL1 is over an entire surface of the planarization layer 165 on which the pixel defining layer 190 is formed. The first functional layer CL1 may include at least one of a hole injection layer HIL and a hole transport layer HTL. The hole injection layer HIL and the hole transport layer HTL allow holes injected from the pixel electrode PE to be easily transported. The hole injection layer HIL may include CuPc or starburst type-amines such as TCTA, m-MTDATA, or IDE406. The hole transport layer may include, for example, TPD or α-TPD.

The first functional layer CL1 may be formed through a solution process, e.g., a dropping process or an ink-jet process. The solution process may be carried out, for example, in an overall coating method or a linear coating method. In an exemplary embodiment, the first functional layer CL1 is not on the sealing area SA on which the sealing member 300 is to be disposed. For example, the first functional layer CL1 may be over an entire surface of the first substrate 110 except the sealing area SA.

A light emitting layer EML may be on the first functional layer CL1. The light emitting layer EML may include one or more emitting layers, e.g., red, green, and blue light emitting layers. The red, green, and blue light emitting layers may be at red, green and blue pixels, respectively. In one embodiment, the red, green, and blue light emitting layers may be sequentially stacked at one pixel to form a white pixel. The light emitting layer EML may be formed through a solution process, e.g., a dropping process or an ink-jet process.

A second functional layer CL2 is over an entire surface of the planarization layer 165 on which the light emitting layer EML is formed. The second functional layer CL2 may include at least one of an electron transport layer ETL and an electron injection layer EIL. The electron injection layer and the electron transport layer allow electrons injected from the common electrode CE to be easily transported. The electron transport layer may include $Alq_3$, PBD, TNF, BMD, BND, and/or another material. The electron injection layer may include LiF, NaCl, CsF, $Li_2O$, BaO, and/or another material.

The second functional layer CL2 may be formed through a solution process, e.g., a dropping process or an ink-jet process. The solution process may be carried out, for example, in an overall coating method or a linear coating method. In one exemplary embodiment, the second functional layer CL2 may not be on the sealing area SA on which the sealing member 300 to be disposed. For example, the second functional layer CL2 may be over an entire surface of the first substrate 110 except the sealing area SA.

The common electrode CE is on the second functional layer CL2.

The pixel electrode PE and the common electrode CE may include one of a transmissive electrode, a transflective electrode, and a reflective electrode.

A transparent conductive oxide ("TCO") may be used to form a transmissive electrode. Examples of TCO may include indium tin oxide (ITO), indium zinc oxide (IZO), zinc oxide (ZnO), and indium oxide ($In_2O_3$).

Magnesium (Mg), silver (Ag), gold (Au), calcium (Ca), lithium (Li), chromium (Cr), aluminum (Al), copper (Cu), or an alloy thereof or another metal may be used to form a transflective electrode and a reflective electrode. In such an exemplary embodiment, whether an electrode is a transflective type or a reflective type may depend on the thickness of the electrode. The transflective electrode has a predetermined thickness (e.g., about 200 nm or less). The reflective electrode has a predetermined thickness, e.g., about 300 nm or more. As the thickness of the transflective electrode decreases, light transmittance and resistance may increase. As the thickness of the transflective electrode increases, light transmittance may decrease.

The transflective electrode and the reflective electrode may have a multilayer structure which includes a metal layer having a metal or a metal alloy and a TCO layer stacked on the metal layer.

The sealing member 300 may bond the first substrate 110 to the second substrate 210. The sealing member 300 may seal the display area DA to substantially prevent infiltration of oxygen or moisture and may be at the non-display area NDA along an edge of the display area DA. The sealing area SA may correspond to a portion of the non-display area NDA at which the sealing member 300 is disposed.

The sealing member 300 may be an inorganic material. For example, the sealing member 300 may be a glass frit. The sealing member 300 may be applied using, for example, a dispenser or in a screen printing method. The glass frit may be, for example, glass raw material in the form of powder. In one embodiment, the glass fit may be in a paste state including, for example, $SiO_2$ as a main material, and a laser or infrared absorber material, an organic binder material, and/or a filler material for reducing a thermal expansion coefficient.

A laser beam is irradiated to the sealing member 300 until the sealing member 300 is melted and cured to bond the first substrate 110 to the second substrate 210. For example, in a vacuum packaging method using a laser to bond the first substrate 110 and the second substrate 210 to each other with the sealing member 300, the sealing member 300 is applied along an edge of the first substrate 110 and then heated to be pre-cured such that a binder component and the like in the glass frit may be removed.

Subsequently, the second substrate 210 is aligned on the first substrate 110. Then, the second substrate 210 and the first substrate 110 are inserted into a calcination furnace in a vacuum state and heated to an appropriate temperature below a melting point of the glass frit. In such a state, only a portion applied with the glass fit is locally heated by a laser beam to melt the glass frit, and to thereby bond the first substrate 110 to the second substrate 210.

Since a residual organic substance having a same configuration as those of the organic light emitting layers CL1, EML, and CL2 is not on the sealing area SA on which the sealing member 300 is disposed, the display device according to an exemplary embodiment may improve adhesiveness of the sealing member 300.

Figure 4A:
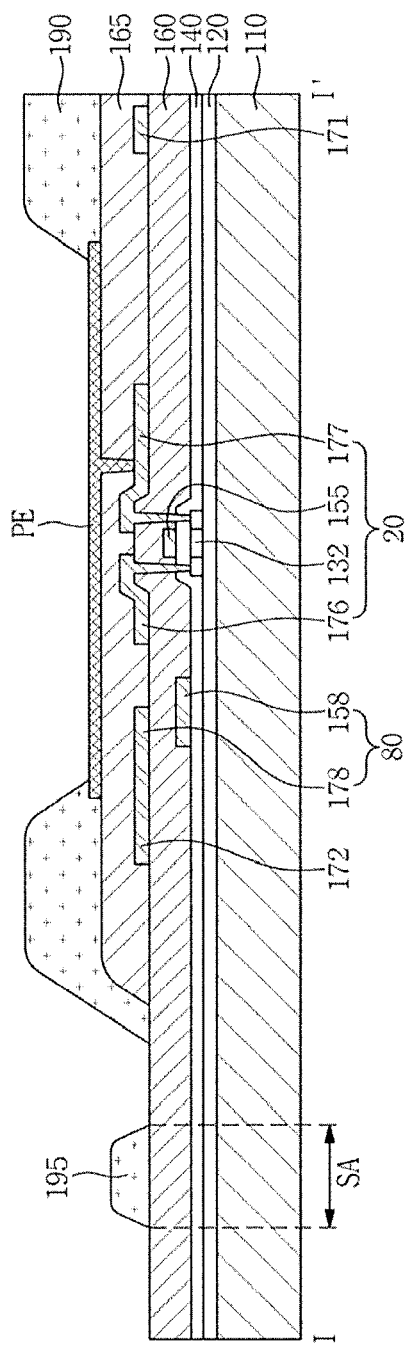

FIGS. 4A-4G illustrate an embodiment of a method for manufacturing the display device. Referring to FIG. 4A, the buffer layer 120 is formed on the first substrate 110 and a TFT structure including the driving TFT 20 and the capacitor 80 is formed thereon. Subsequently, the planarization layer 165 is formed on the TFT structure. The planarization layer 165 may be formed, for example, through a chemical vapor deposition ("CVD") process, a spin coating process, a sputtering process, a vacuum deposition process, a printing process, or the like.

Next, the pixel electrode PE is formed on the planarization layer 165. The pixel electrode PE is connected to the drain electrode 177 of the driving TFT 20 through the contact hole defined in the planarization layer 165.

Subsequently, the pixel defining layer 190 is formed on the planarization layer 165. The pixel defining layer 190 is formed to overlap an edge of the pixel electrode PE and expose at least a portion of the pixel electrode PE. When forming the pixel defining layer 190, a laser absorption layer 195 is formed at the sealing area SA. The laser absorption layer 195 may absorb a laser beam in a laser process and may be removed together with a residual organic substance thereabove.

The laser absorption layer 195 may be formed in a substantially same process using a material substantially the same as material in the pixel defining layer 190. Ion one exemplary embodiment, the laser absorption layer 195 may be formed in a separate process using a material different from the material in the pixel defining layer 190.

The laser absorption layer 195 may be formed to have a thickness different from the thickness of the pixel defining layer 190. For example, the laser absorption layer 195 may have a thickness less than the thickness of the pixel defining layer 190. The pixel defining layer 190 and the laser absorption layer 195 may be formed to have different thicknesses, for example, by applying a pixel defining layer forming material and using masks having different transmittances.

Referring to FIG. 4B, the first functional layer CL1 is formed over an entire surface of the first substrate 110 on which the pixel defining layer 190 and the laser absorption layer 195 are formed. The first functional layer CL1 may be formed through a solution process, e.g., a dropping process or an ink-jet process. The solution process may be carried out, for example, in an overall coating method or a linear coating method.

Figure 4C:
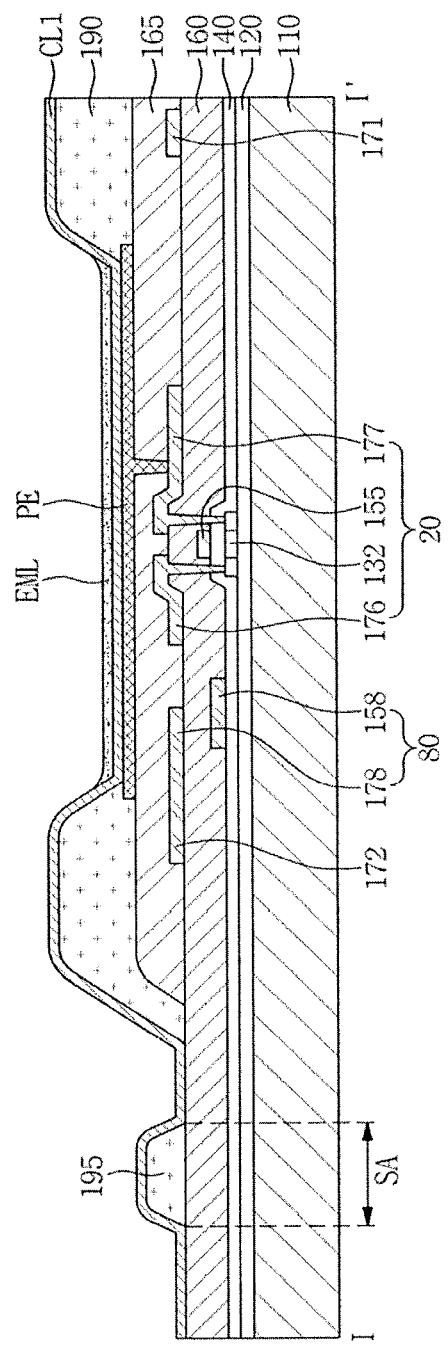

Referring to FIG. 4C, the light emitting layer EML is formed on the first functional layer CL1. The light emitting layer EML may include one or more color light emitting layers, e.g., one or more red, green, and blue light emitting layers. The red, green, and blue light emitting layers may be formed at the red, green, and blue pixels, respectively. In one embodiment, multiple light emitting layers may be used to emit white light.

Referring to FIG. 4D, the second functional layer CL2 is formed over an entire surface of the first substrate 110 on which the light emitting layer EML is formed. The second functional layer CL2 may be formed through a solution process, e.g., a dropping process or an ink-jet process. The solution process may be carried out, for example, in an overall coating method or a linear coating method.

Figure 4E:
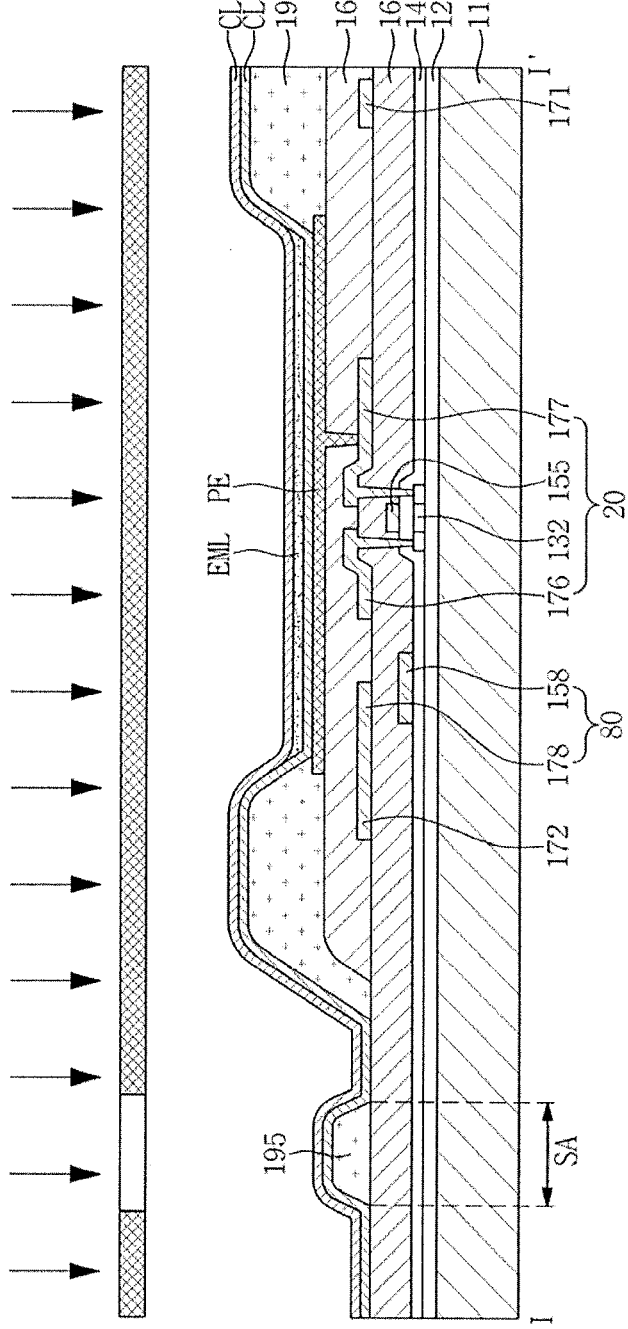
Figure 4F:
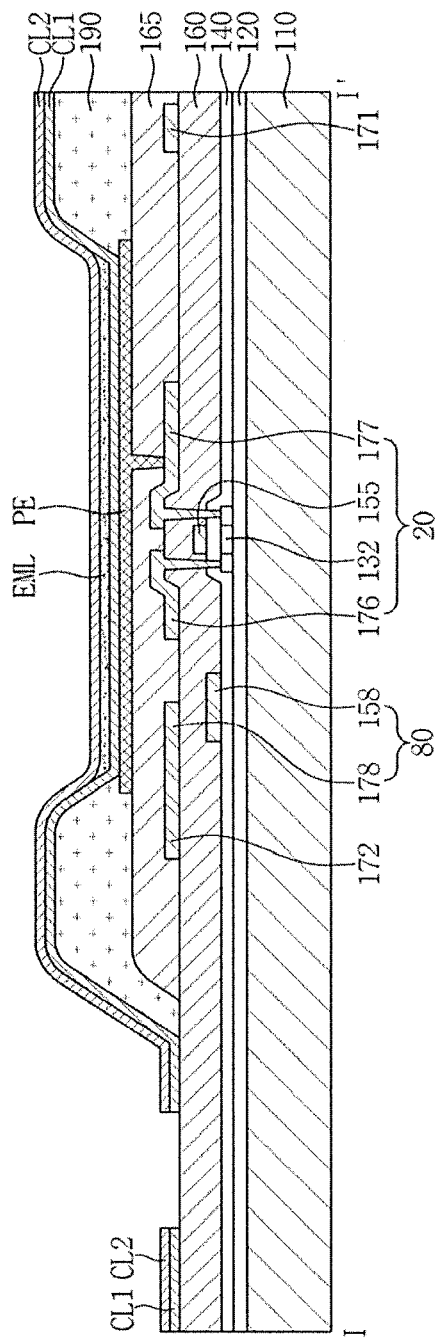

Referring to FIG. 4E, a laser beam is irradiated to the sealing area SA. The laser beam irradiated to the sealing area SA may be a laser beam having a wavelength which may be partially absorbed by the first functional layer CL1 and the second functional layer CL2, may be largely absorbed by the laser absorption layer 195, and may not reach the insulating interlayer 160 below the first functional layer CL1, the second functional layer CL2, and the laser absorption layer 195.

The laser irradiating the laser beam to the sealing area SA may be, for example, a YAG laser, an excimer laser, or another type of laser. The YAG laser may have a wavelength of, for example, a third harmonic (about 355 nm) of the fundamental wavelength of 1064 nm. Through the use of the laser beam having a wavelength of about 355 nm, the laser beam may be mostly absorbed in the laser absorption layer 195 and damages on the insulating interlayer 160 may be substantially prevented. The wavelength may be different in another embodiment.

The laser absorption layer 195 is rapidly heated by the laser beam being irradiated to the sealing area SA, thus causing ablation. Accordingly, referring to FIG. 4F, the laser absorption layer 195, the first functional layer CL1, and the second functional layer CL2 on the sealing area SA are removed substantially simultaneously.

Figure 4G:
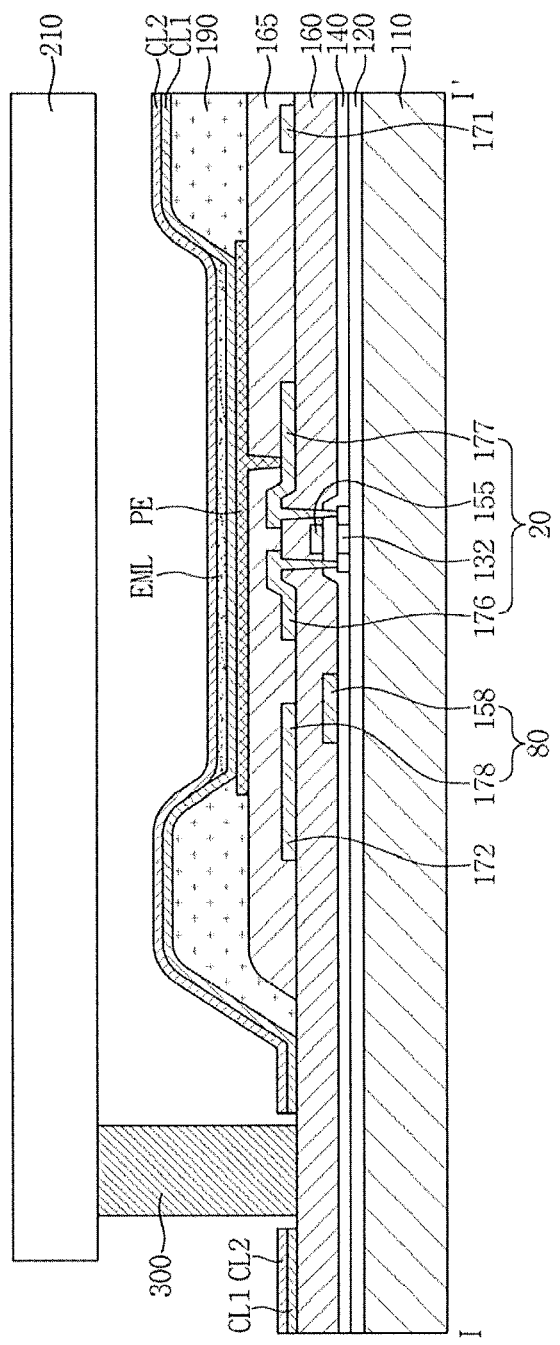

Referring to FIG. 4G, the sealing member 300 is formed on the sealing area SA from which the laser absorption layer 195, the first functional layer CL1, and the second functional layer CL2 are removed. Subsequently, the second substrate 210 is aligned on the first substrate 110, and only an area applied with the sealing member 300 is locally heated using a laser beam such that the first substrate 110 is bonded to the second substrate 210.

In accordance with one or more of the aforementioned exemplary embodiments, a method for manufacturing a display device may effectively remove residual organic substances on a sealing area, by forming a laser absorption layer that is capable of absorbing a laser beam on the sealing area and then irradiating a laser beam to remove the laser absorption layer and the organic substances on the laser absorption layer.

Further, according to one or more exemplary embodiments, a method for manufacturing a display device may simplify the manufacturing process by forming the laser absorption layer using a material that is substantially the same as a material in a pixel defining layer.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
   a first substrate including a non-display area and a display area, the display area including a plurality of pixels that are to emit light to display an image;
   a second substrate opposing the first substrate;
   a sealing material to seal the first substrate and the second substrate;
   a thin film transistor structure on the first substrate at the display area;
   a pixel electrode on the thin film transistor structure and connected to the thin film transistor structure;
   a pixel defining layer overlapping an edge of the pixel electrode;
   a first functional layer on the first substrate on which the pixel defining layer is formed;
   a light emitting layer on the first functional layer and overlapping the pixel electrode; and
   a common electrode on the light emitting layer, wherein the non-display area includes a sealing area which includes the sealing material and wherein the first functional layer is spaced apart with the sealing material therebetween in plan view.

2. The display device as claimed in claim 1, further comprising:
   a second functional layer on the first substrate on which the light emitting layer is formed.

3. The display device as claimed in claim 2, wherein the second functional layer is over an entire surface of the first substrate except the sealing area.

4. The display device as claimed in claim 2, wherein the second functional layer does not overlap the sealing area.

5. The display device as claimed in claim 2, wherein the second functional layer includes at least one of an electron injection layer and an electron transport layer.

6. The display device as claimed in claim 2, wherein the second functional layer is spaced apart with the sealing material therebetween in plan view.

7. The display device as claimed in claim 1, wherein the first functional layer includes at least one of a hole injection layer and a hole transport layer.

8. The display device as claimed in claim 1, wherein the first functional layer is over an entire surface of the first substrate except the sealing area.

9. The display device as claimed in claim 1, wherein the first functional layer directly contacts the pixel defining layer.

10. The display device as claimed in claim 1, wherein the sealing area is defined along an edge of the display area.

11. The display device as claimed in claim 1, wherein the sealing material includes a glass frit.

12. A method of manufacturing a display device, the method comprising:
   preparing a first substrate including a non-display area and a display area, the display area including a plurality of pixels to emit light to display an image;
   forming a thin film transistor structure on the first substrate;
   forming a pixel electrode on the thin film transistor structure;
   forming a pixel defining layer on the pixel electrode;
   forming a laser absorption layer on the first substrate at the non-display area;
   forming a first functional layer over an entire surface of the first substrate on which the pixel defining layer and the laser absorption layer are formed; and
   irradiating a laser to the laser absorption layer.

13. The method as claimed in claim 12, wherein the laser absorption layer is formed along an edge of the display area.

14. The method as claimed in claim 12, wherein forming the pixel defining layer and forming the laser absorption layer are performed simultaneously.

15. The method as claimed in claim 12, wherein the first functional layer includes at least one of a hole injection layer and a hole transport layer.

16. The method as claimed in claim 12, wherein the first functional layer is formed through one of a dropping process and an ink-jet process.

17. The method as claimed in claim 12, further comprising:
   forming a second functional layer over an entire surface of the first substrate on which the first functional layer is formed.

18. The method as claimed in claim 17, wherein the second functional layer includes at least one of an electron injection layer and an electron transport layer.

19. The method as claimed in claim 18, wherein the second functional layer is formed through one of a dropping process and an ink-jet process.

* * * * *